United States Patent [19]

Lightbody et al.

[11] 4,443,756
[45] Apr. 17, 1984

[54] APPARATUS AND METHOD FOR TESTING CIRCUIT BOARDS

[76] Inventors: James D. Lightbody; William S. Lightbody, both of 32600 Fairmount, Pepper Pike, Ohio 44124

[21] Appl. No.: 210,539

[22] Filed: Nov. 26, 1980

[51] Int. Cl.³ ............................................ G01R 15/12
[52] U.S. Cl. ........................... 324/73 PC; 324/158 F; 324/73 R
[58] Field of Search ............... 324/73 R, 73 PC, 72.5, 324/158 F, 158 P

[56] References Cited

U.S. PATENT DOCUMENTS

| | | |
|---|---|---|
| 3,016,489 | 1/1962 | Briggs et al. . |
| 3,235,797 | 2/1966 | Boscia ............................ 324/158 F |
| 3,441,849 | 4/1969 | Bennett et al. . |
| 3,564,408 | 2/1971 | Schulz et al. . |
| 3,584,300 | 6/1971 | Schulz . |
| 3,654,585 | 4/1972 | Wichersham . |
| 3,806,800 | 4/1974 | Bove et al. . |
| 3,806,801 | 4/1974 | Bove . |
| 3,963,986 | 6/1976 | Morton et al. . |
| 3,996,516 | 12/1976 | Luther . |
| 4,017,793 | 4/1977 | Haines . |
| 4,038,599 | 7/1977 | Bove ................................ 324/158 F |
| 4,099,119 | 7/1978 | Goetz . |
| 4,115,735 | 9/1978 | Stanford . |
| 4,180,203 | 12/1979 | Masters . |

OTHER PUBLICATIONS

Multicontact Electrical Probe, Western Electric Technical Digest No. 20, Oct. 1970.
Multicontact Test Probe, I.B.M. Technical Disclosure Bulletin, vol. 17, No. 2.

Primary Examiner—Michael J. Tokar

[57] ABSTRACT

An apparatus for testing circuit boards is disclosed. The apparatus uses double ended electrically conductive pins inserted in a physically programmable pin board in combination with a direct hard wired constant matrix pin board and a programmable comparison device to form the testing apparatus for use in testing circuit boards.

21 Claims, 13 Drawing Figures

APPARATUS AND METHOD FOR TESTING CIRCUIT BOARDS

The invention of this application relates to an apparatus and method for testing circuit boards.

It is an object of this invention to reduce the cost of the testing apparatus and machine. The testing apparatus of this invention is simple. It is easily made. In addition the testing apparatus of this invention reduces the cost of the testing machine used with it by reducing the demands upon such machine.

It is an object of this invention to reduce the cost to test circuit boards after the purchase of the testing apparatus and machine. There is no hand wiring necessary in the testing apparatus of this invention. No special interchangeable test head is needed. The pin board can be relatively light gauge. It is simple for anyone to set up the testing apparatus of this invention for testing any particular circuit board. The testing apparatus of this invention can be quickly and easily set up to test any board at any time. It increases the efficiency of the testing procedure. By lowering the cost of the apparatus by use of a simple pin board, it is economically possible to test many more designs of circuit boards.

It is an object of this invention to increase the reliability of the testing procedure. All hand wiring has been eliminated. The wired connector has been replaced by a small number of address lines. The testing apparatus is simple and easy to understand. It has few parts that need to be modified to test different circuit boards.

It is an object of this invention to increase the versatility of a single testing apparatus. A single testing apparatus of this invention can test a large number of differing boards. The size or quality of the tested circuit board can be changed at any time. It is not necessary to purchase more interfaces or larger connectors to test circuit boards having many points.

It is an object of this invention to increase the availability and quality of the testing procedure. Due to the reduced costs and simplified apparatus automated testing procedures are now available to more companies than before.

Other objects and advantages and a fuller understanding of this invention may be obtained by an examination of the following specification and claims taken in conjunction with the drawings in which:

This invention relates to an apparatus and method for testing circuit boards.

Presently circuit boards are tested by means of a hand wired testing jig connected through interface boards to a testing machine. This jig is made by drilling a specially made interchangeable test head, the test head having an integral connector, inserting single ended pins into the drilled holes in the test head and then hand hard-wiring each and every pin to the connector that is integral with the test head. The connector is then plugged into the interface of a testing machine. For each and every pin in the test head there must be a discrete hand or machine run wire to the connector and from the connector to the interface of the testing machine - 8000 tested points must have 8000 hand run wires.

This is very inefficient and costly.

Our invention utilizes a pin board, double ended pins and a matrix testing jig to test circuited circuit boards. Each pin is connected to the testing machine through the pin's contact with a pad on the matrix testing jig. There is no need for specially made testing heads having integral connectors nor the hand hard wiring of the pins to the connector. 8000 tested points need have no hand run wires. The direct computer matrix address of the pads reduces the need for all but a bare minimum number of address lines.

The apparatus of our invention includes a universal matrix testing jig 10, a pin board 11 and double ended pins 12. See FIGS. 1–3.

Figure 1:
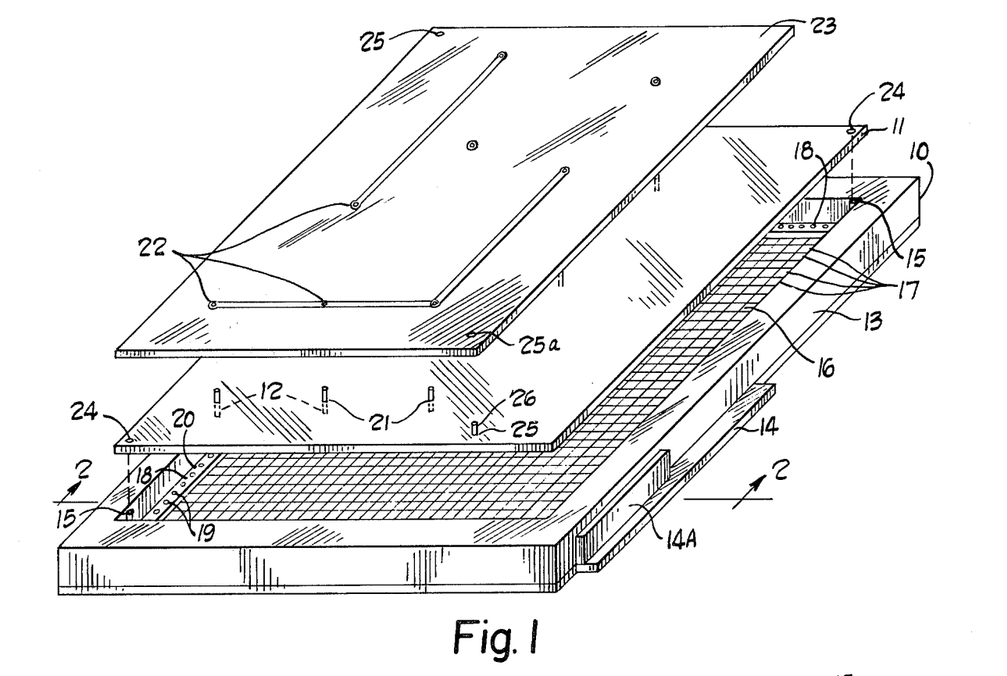
FIG. 1 is an expanded perspective drawing of a testing apparatus constructed in accord with the teachings of this invention.

The matrix testing jig 10 includes a frame 13, a connector 14, pin board locating pins 15 and a matrix substrate 16.

The matrix substrate 16 is formed of a multitude of electrically conductive discrete pads 17. The matrix substrate 16 is universal for use in testing differing circuit boards. Each pad 17 is electrically insulated from every other pad 17. In the embodiment shown the pads 17 are laid out in rows and columns. Each pad 17 is electrically circuited to the testing machine in such a way that each individual pad 17 can be addressed and/or read by the testing machine. This is accomplished in set circuitry; the circuits are never altered. The matrix substrate 16 may be a circuit board itself. This is the preferred embodiment. The pads 17 are formed upon its surface through conventional etching techniques. Alternately they could be flat head rivets. The circuit board in the preferred embodiment includes the matrix, digital address and read circuitry and the connector 14. 8000 points can be addressed through a line connector 14 having 180 lines, 80×100 non-digitalized matrix, or 30 lines, a completely digitalized matrix having separate address and read lines - 8192 points, or two lines go-no go after all the circuitry of this application. (Depending on the matrix technique and specific circuitry used this number could vary. In any event, it would be small.) In an alternate configuration, and for direct connection with most of the existing testing machines, each pad 17 could have a discrete circuit leading from that particular pad 17 to the connector 14. The pads 17 themselves would still be laid out in a matrix form. For 8000 points there would be an 8000 circuit connector 14.

The size of the matrix substrate 16 and of the pads 17 can be varied as the needs of the customer dictate. For example, an "8½"×11" matrix substrate 16 containing 80×100 pads 17 (roughly 1/10"×1/10" pads 17) would form a testing apparatus to test most circuit boards sizes and do so with a 99%+ accuracy. Note that it is all right for pins 12 to contact more than one pad 17 as long as the pins 12 continue to contact the same pads 17; Any errors induced by this configuration would occur mostly due to any chance spacing of two non-circuitry connected pins 12 less than 1/10" apart, and few circuit boards have more than very small numbers of pads with such spacing.

If a larger size board is to be tested by, or more accuracy is needed of, a given testing apparatus such aims can be easily satisfied; the matrix substrate 16 can be made any size - the pads 17 can be made exceedingly small. For example a matrix substrate 16 could be made 36"×36" with 3600×3600 pads 17 (roughly 1/100" spacing) or 36×36 pads 17 (roughly 1" spacing). Please note that with the matrix circuitry and the digitalized address lines every pad 17 on the oversize (36"×36") small pad (3600 ×3600 pad 17) matrix substrate 16 could be separately addressed and read through a forty-six line connector 14. (Again depending on the matrix technique specific matrix circuitry used it could be greater or less. In any event it would be a small number.)

A frame 13 surrounds the matrix substrate 16, whatever its size. In the embodiment shown the matrix substrate 16 is glued to the underside of the frame 13 with the connector 14 protruding out of a notch in the side of the frame 13. The frame rigidly holds the matrix substrate 16.

The frame 13 also holds the pin board 11 in position in respect to the matrix substrate 16.

It is important that the pin board 11 not move in respect to the matrix substrate 16; any motion could alter the orientation of the pins 12 in respect to the pads 17 and induce the testing machine to signify that good circuit boards had shorts or opens not actually present on such circuit boards.

Figure 2:
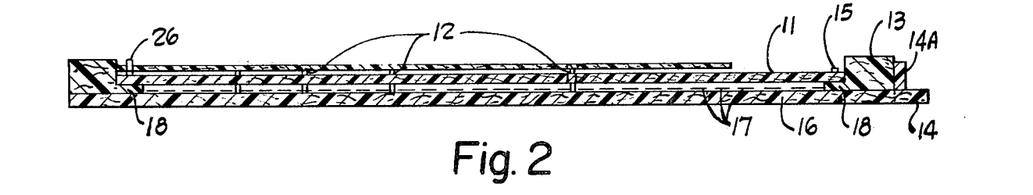
FIG. 2 is a cut away side view of the testing apparatus of FIG. 1 taken along lines 2—2 of that figure.

Small lips 18 serve to hold the pin board 11 vertically spaced in respect to the matrix substrate. (The pins 12 also help in this regard.)

Locating pins 15 in combination with a tight fit of the pin board 11 in respect to the frame 13 prevent any horizontal movement of the pin board 11.

Alternately or additionally horizontal support can be provided by adding vacuum holding holes 19 in the lips 18 of the frame 13 and/or elsewhere. When a pin board 11 is placed in position in respect of the matrix substrate 16 the vacuum holding holes 19 would be energized to draw the pin board 11 tightly down against the frame 13 and thus secure it against any motion in respect of the matrix substrate 16. Anti-skid material 20 would further facilitate this vacuum holding.

The frame 13 is preferably constructed of a dimensionally stable electrically non-conductive material.

The pin board 11 is a blank electrically non-conductive board. It is sized to be securely held by the frame 13 (Whether by fastening pins 15, the inside dimensions of the frame walls, a vacuum hold and/or whatever). The pin board 11 should be thick enough to insure a solid uniform support of the pins 12 during the full length of testing; any error introduced by a flexing of the pin board 11 or motion of the pins 12 in respect to the pin board 11 may induce the testing machine to indicate opens or shorts in what is really a good circuit board. As the number of circuit boards to be tested by a single pin board 11 and the size of the pin board 11 increases and the size of the pads 17 on the matrix substrate 16 decreases the pin boards' 11 thickness may need to be increased.

Please note the pin boards' 11 main function is to retain the pins 12 in place in respect to lateral and wobbling movements, not against every up and down movement; the pins 12 in the embodiment disclosed pass all up and down forces directly to the matrix substrate 16.

The pin board 11 has a pattern of holds 21 in it. These holes 21 are laid out to match the pattern of points 22 on the circuit board 23 that is to be tested by the testing apparatus.

In practice, these holds 21 in the pin board 11 are made by drilling the pin board 11 with the drilling coordinates of the points 22 on circuit board 23 to be tested. This is easily accomplished by the drilling of such pin board 11 with the drilling program of the circuit board 23 to be tested. In is preferred that a single sized drill is used for this operation so as to facilitate later pinning operations and to foreclose the possibility of pin-mismatch wobbling.

The pin board 11 also has a pair of locating holes 24 and orientation holes 25 in it. The locating holes 24 are used with locating pins 15 in restraining movement of the pin board 11. Orientation pins 26 are inserted into the second set of holes 25. These orientation pins 26 are located in reference to the pattern of holes 21 on the pin board 11 to equal the location of the orientation holes 25a in reference to the pattern of points 22 on the circuit board 23 being tested with that particular pin board 11. When the circuit board 23 being tested is placed upon the matrix testing apparatus the combination of the orientation pins 26 on the pin board 11 and orientation holes 25a present on the circuit board 23 being tested fixes the pattern of points 22 on the circuit board 23 exactly above the pattern of holes 21 on the pin board 11. The orientation pins 26 and orientation holes 25a together form the means for locating the circuit board 23 being tested in respect to the pin board.

Most circuit boards currently being produced use production orientation holes to locate circuit boards during manufacturing operations. These production orientation holes could, and ideally would, also be used during the testing procedures as orientation holes 25a. The pin board 11 would be drilled accordingly. Alternately new holes could be drilled or blocks or other locating means could be used to locate the circuit board.

In the embodiment disclosed the pin board 11 is a double thickness insulating board ($\frac{1}{4}$"). A bare circuit board could also be used as a pin board 11 providing that the sides of the pins 12 are electrically insulated from any electrically conductive circuit lines present on such circuit board and that proper attention is paid to the diameter of the pins 12 in relation to the holes they are to be inserted into; a bare circuit board will have active lines and possibly also differing sized holes.

Figure 3:
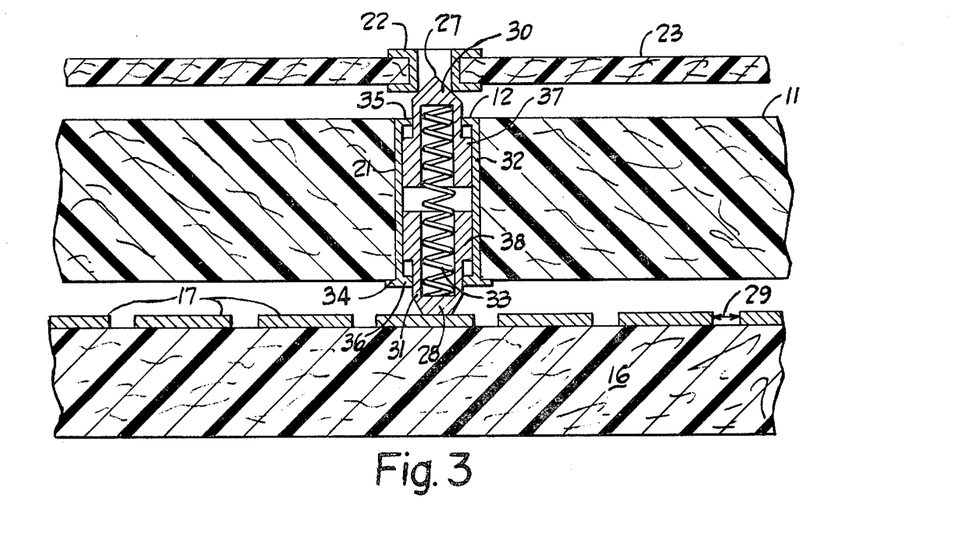
FIG. 3 is an enlarged drawing of the area of the bisected pin in FIG. 2.

Double ended longitudinally extendable electrically conductive pins 12 are in the holes 21 in the pin board 11. The pins should fit tightly with neither lateral movement nor wobbling.

The top end 27 of the pins 12 should be shaped to insure a good contact with the point 22 on circuit board 23 to be tested.

The bottom end 28 of the pins 12 should be shaped so as to insure contact with a pad 17 on the matrix substrate 16. The bottom end 28 of the pins should ordinarily have a contact diameter a little larger than the spaces 29 between the pads 17 of the matrix substrate 16. This would insure that in no event would contact with a pad not be present. There is no harm in a bottom end 28 of a pin contacting more than one pad 17 at a time as long as the same combination of pads 17 are always contacted during subsequent programming and testing operations.

In the embodiment shown the pins 12 are double ended collared spring loaded pins 12. Each pin 12 has a top portion 30, a bottom portion 31, a collar 32 and a spring 33.

The collar 32 has a shoulder 34 and two inwardly extending lips 35, 36.

The shoulders 34 of the collar 32 contact the bottom surface of the pin board 11 to insure a uniform insertion depth of the pins 12 and to prevent loss of the pins 12 during insertion, usage and storage.

The top inwardly extending lip 35 of the collar 32 cooperates with an outwardly extending shoulder 37 on the bottom of the top portion 30 to retain the top portion 30 in position in respect to the collar 32.

Since in the embodiment shown the testing apparatus is testing bare circuit boards 23, and the point of testing is a holed circuit pad, the top end 27 of the pin 12 is pointed. For testing circuit boards assembled with electronic components a flat or other tip may be desired to insure a good contact.

The bottom inwardly extending lip 36 of the collar 32 cooperates with an outwardly extending shoulder 38 on the top of the bottom portion 31 to retain the bottom portion in respect to the collar 32. In the embodiment shown the bottom end 28 of the bottom portion 31 is flat with a diameter 1.5 times the space between the pads.

The top portion 30 and bottom portion 31 are electrically conductive. The collar 32 need not be.

A spring 33 acts between the top portion 30 and the bottom portion 31. The spring 33 serves to insure good contact of those portions with the circuit board to be tested 23 and the pad 17 of the matrix substrate respectively and to transfer electricity between the top portion 30 and bottom portion 31. The spring also passes through the pin board 11 the downward pressure exerted on the circuit board to be tested 23.

Orientation pins 26 are inserted into holes 25 and locked in position.

When all of the holes 21 have been pinned and orientation pins 26 inserted into holes 25, the pin board 11 is attached to the matrix testing jig 10. The pattern and number, the density, of the pins 26 is generally different than the patter and number, the density, of pads 17.

It is important that the pin board 11 not move in respect to the matrix substrate 16; any motion could induce the testing machine to find shorts or opens in a good board for reason of movement of the pins 12 in respect to the matrix substrate 16.

In the embodiment shown the pin board 11 is held in place in respect to the matrix substrate 16 by the holes 24 fitting over the locating pins 15, by the inside edges of the frame 13, by the lip 18 of the frame 13 and by a vacuum applied to holes 19 through the lip 18 of the frame 13.

Once a pin board 11 corresponding to a certain particular circuit board 23 to be tested has been pinned and affixed to the matrix testing jig 10 the testing apparatus is complete; it needs only to be interconnected to a testing machine, and for circuit boards 23 to be located on it for testing of that particular circuit board to commence.

To test a circuit board that circuit board is placed onto the testing apparatus. The circuit boards 23 are located on the testing apparatus by their orientation holes 25a snugly fitting over the orientation pins 26 of the pin board 11: the pattern of points 22 on the circuit board 23 being tested are in contact with the pattern of pinned holes 21 on the pin board 11. Each tested point 22 on the circuit board 23 is contacted by the top portion 30 of a pin 12 on the pin board 11. The bottom portion 31 of every one of the pins 12 is in contact with at least one pad 17. Since all of the pads 17 have lines leading to the testing machine these contacts will be part of the circuit that each point has leading to the testing machine.

The test machine will address and read every tested point over these circuits.

In an alternate configuration the matrix substrate 16 could be constructed out of flexible materials to reduce the number of parts necessary for the testing apparatus to test circuit boards 23. See FIGS. 4 and 5.

Figure 4:
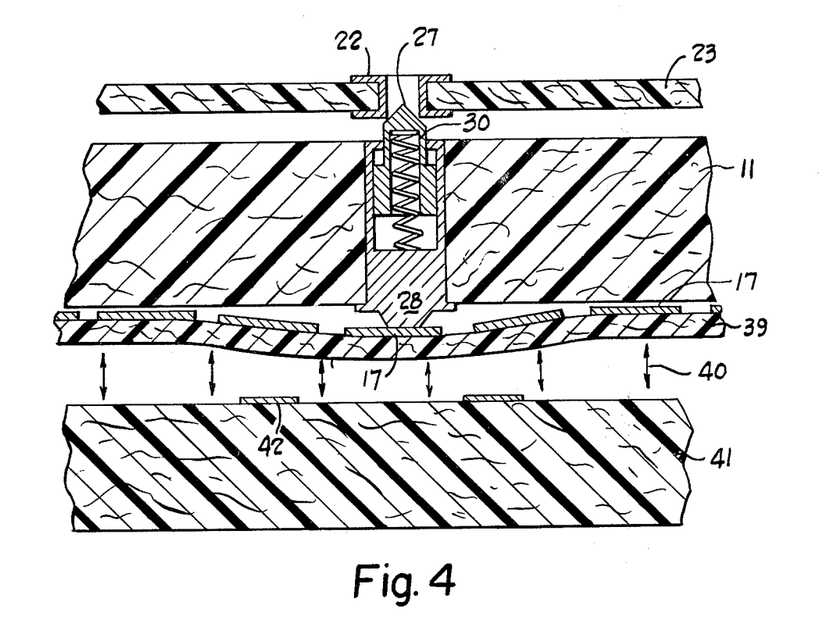
FIGS. 4 and 5 are is an enlarged cutaway side view of alternate matrix apparatii.

In the first flexible matrix substrate embodiment, FIG. 4, the flexibility of the matrix substrate 39 in combination with an upward force 40 replaces the spring loaded bottom portion 31 of the pins 12. The matrix 39 directly contacts the bottom ends 28 of the pins 12. An upward force in combination with the flexibility of the substrate 39 replaces the spring loading of the bottom ends 28. The upward force 40 is provided by a spongy material (not shown) or by air pressure between the flexible matrix substrate 39 and a fixed subplate 41. The air pressure is generated by an air pump (not shown) and is selectively applied through holes 42 in the fixed subplate 41. The shape of the bottom ends 28 of the pins 12 remain the same as in the fixed matrix substrate 16 version.

Figure 5:
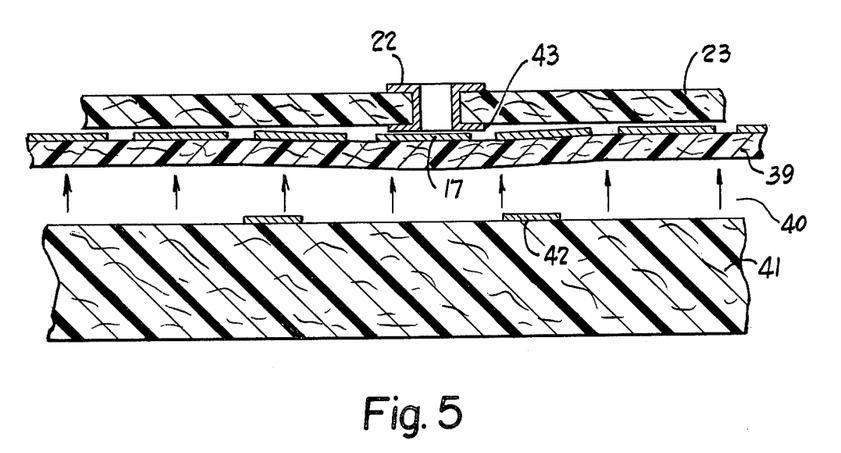

In the second flexible substrate embodiment, FIG. 5, the flexibility of the flexible matrix substrate 39 in combination with an upward force 40 replaces the pins 12 and the pin board 11. The flexible matrix 39 directly contacts the points 22 on the circuit board 23 being tested. If the circuit board 23 being tested has insulated lines 43 (or if an equivalent insulating mask (not shown) is inserted between the flexible matrix substrate 39 and the circuit board 23 being tested)) only the points 22 on the circuit board 23 will be contacted by the pads 17 of the flexible matrix substrate 39. If the circuit board 23 being tested does not have insulated lines 43 (or an equivalent insulating mask) the entire circuit on the circuit board 23 being tested will be contacted - both lines and points 22. If both lines and points 22 are being contacted, the electrical circuitry later described can be programmed to ignore the coordinates of the lines and address and read only the points 22. The upward force 40 is provided by again a spongy material or air pressure between the flexible matrix substrate 39 and a fixed sub-plate.

A circuit board having more points 22 than the testing machine can be tested by our invention, albeit with a slightly decreased accuracy, by using pads 17 larger than ideal and accepting the concomitent increased likelihood of some of the closely spaced points 22 on the circuit board being tested 23 being connected through the pins 12 and the pads 17. Any shorts or opens between some of such closely spaced points 22 would not be ascertainable due to the pad 17 interconnections between such points 22 in this lesser pad testing apparatus.

For example, if a circuit board being tested 23 has 16,000 points 22 and one wants to use a testing machine having the capability of testing 8000 points, an 8000 pad 17 matrix substrate 16 could be used to test the 16,000 point 22 circuit board 23. Any cross-circuiting of some closely spaced points 22 through the pins 12 and the pads 17 would be accepted as a cost of the procedure. Flaws between such closely spaced points 22 would not be discovered. Otherwise the circuit board 23 would be tested with an acceptable degree of accuracy.

Similarly a matrix substrate 16 having more pads 17 than the point testing capabilities of a testing machine can be used with such limited testing machine by programming the testing machine to scan only the active pads present on such substrate.

For example, if the matrix substrate 16 being used has 16,000 pads and in consideration of the fact that the circuit boards 23 being tested in this example ordinarily would have only 5,000 active points 22 one wants to use a testing machine having the capability of testing 8,000 points with this 16,000 pad matrix substrate, one could circuit only the active 5,000 points to the 8,000 point testing machine; only the active 5,000 coordinates would be scanned not the entire 16,000 pads 17.

This would best be accomplished by programming the central cpu of the preferred circuitry disclosed hereafter to automatically electrically connect the active coordinates to the testing machine, i.e. to function as a wire from each active pad to the testing machine disregarding all inactive pads. Manual connection or programming, though possible, would be difficult and time consuming.

Since the cost of most existing testing machines are directly related to the number of points being tested by such machines, these reductions in pad number, whether physical or equivalent, would dramatically reduce the cost of such machines; no longer does a manufacturer have to purchase a testing machine capable of testing his most challenging board point for point or in the future of testing the most demanding substrate 16. A machine capable of testing a lesser number of points or pads could be used with accuracy.

This has the result of increasing the practical and economic viability of testing circuit boards over that previously available to a manufacturer.

In either the fixed or flexible matrix substrate configurations the pads 17 are electrically addressed and read by the testing machine. This is accomplished in set circuitry; only the programming of the testing machine and/or pin board 12 are altered in testing differing circuit boards 23, the circuits are not.

In either the fixed or flexible matrix substrate configurations the pads 17 are electrically addressed and read. This is accomplished normally in one of three ways - direct connection (FIG. 6), digital coded (FIG. 7) or matrix (FIG. 8).

Figure 6:
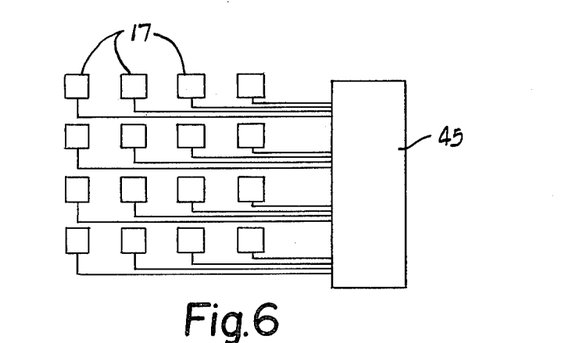
FIGS. 6–9 are simplified block diagrams of an electric circuit that is connected to the testing apparatus of FIG. 1.

In the direct connection circuitry, FIG. 6, each individual pad 17 on the matrix substrate 16 has an individual wire running from that pad 17 to the central processing circuitry 45. An 8000 pad 17 matrix substrate 16 would have 8000 wires between it and the central processing circuitry 45. The central processing circuitry 45 would directly address and read any point 22 along these wires.

In the direct connection circuitry embodiment the individual wires are preferably etched lines on the printed circuit of matrix substrate 16 leading to a connector on the edge of the printed circuit board.

Figure 7:
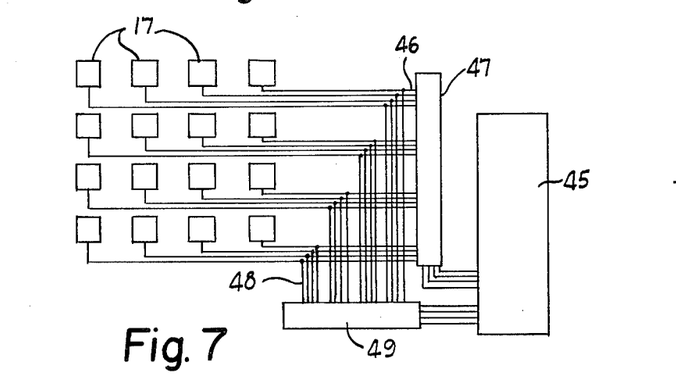
Figure 8:
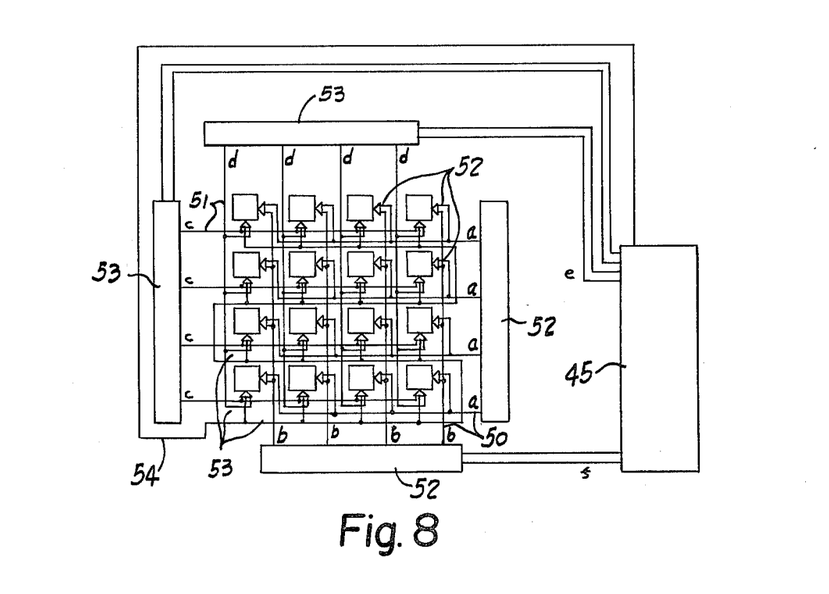

In the digital coded circuitry, FIG. 7, each individual pad on the matrix substrate 16 has two wires leading from it to the circuitry, one wire 46 leading to the digital address circuitry 47 and one wire leading to the digital read circuitry 49. The central processing circuitry 45 would control the digital address circuitry 47 and the digital read circuitry 49. An 8000 (actually 8192) pad 17 matrix substrate 16 would have a 13 wire digital address and a 14 wire digital read between it and the central processing circuitry 45.

In the digital coded circuitry embodiment the matrix substrate 16, the digital address circuitry 47 and the digital read circuitry 49 are preferably on the same printed circuit board. The wires 46 and 48 would be etched lines.

In the matrix coded circuitry, FIG. 8, each individual pad 17 on the matrix substrate 16 is addressed and read over matrix wires 50 and 51 leading from the matrix substrate 16 to the processing circuitry 45. The matrix address wires 50 consist of a multitude of x-y oriented wires a,b addressing the matrix of pads 17 through address "and" devices 52. When a voltage is present on a pair of wires a,b the pad 17 having x-y coordinates corresponding to that particular pair of wires a,b is energized, addressed. The matrix read wires 51 consist of a multitude of x-y oriented wires c,d selectively connecting the matrix pads 17 through read "and" gates 53 to common buss 54. The voltage applied on the pairs of wires c,d selectively connects a pad 17 having x-y coordinates corresponding to that particular pair of wires c,d to the common buss 54. If that particular read pad 17 is energized, either directly by the address wires 50 or by a connection of that read pad 17 to the addressed pad 17 through the circuit board 23 being tested, there will be a voltage present on the common buss 54; an interconnection would be indicated. If that particular read pad 17 is not energized there will be no voltage present on the common buss 54; a non-interconnection would be indicated.

The matrix address circuitry 52 and matrix read circuitry 53 are preferably directly mounted on the back of the matrix substrate in the form of flat pack chips. See FIG. 9. Each chip would address and/or read a portion of the matrix substrate 16.

Figure 9:
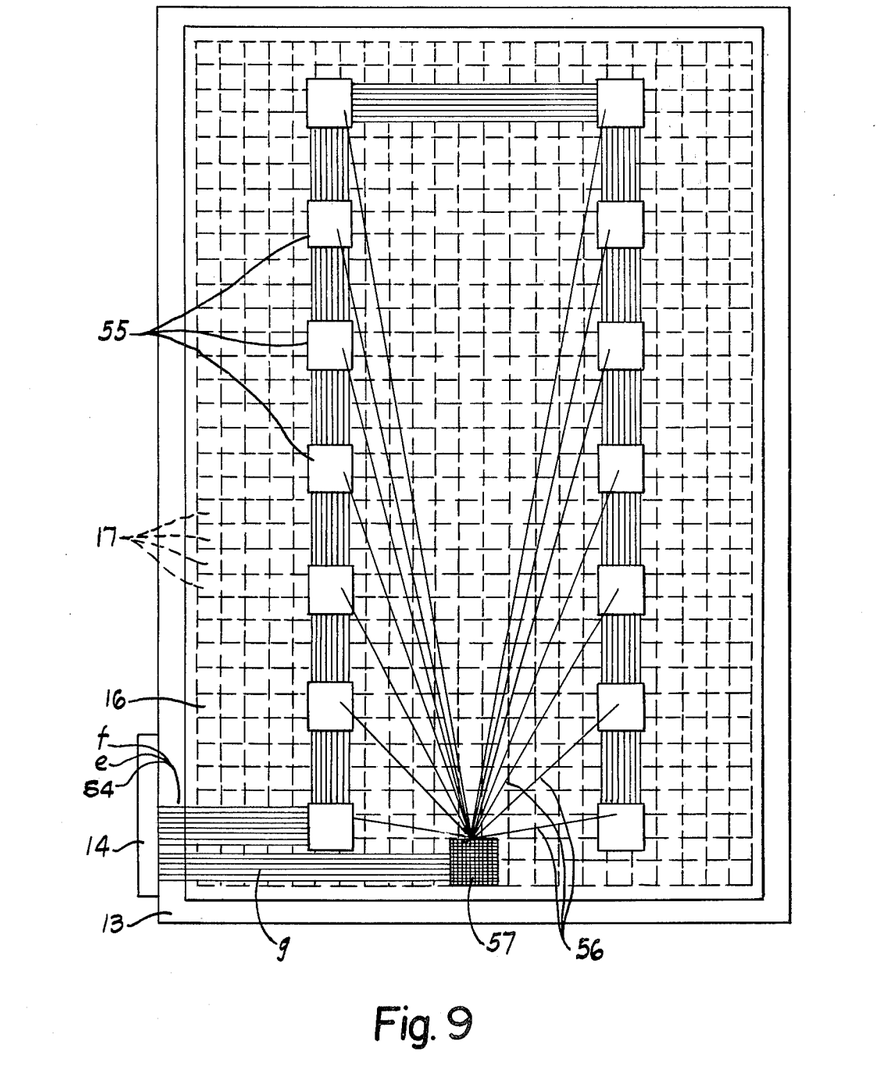

Readily available 64 gate multi-gate "and" flat pack chips 55 present a good compromise between reliability and efficiency of interconnections. Each multi-gate chip 55 would address and/or read a section of pads 17 of the matrix substrate 16. Small wires (not shown for clarity) would run from each multi-gate chip 55 to the series of pads 17 that particular chip 55 is to service.

Each multi-gate chip 55 is connected to parallel address wires f or parallel read wires e along with common buss 54.

The parallel address e and read wires f are sufficient in number to cause the multi-gate chip 55 to scan the full number of pads 17 that chip is to service. Six parallel wires would scan 64 points (not including a ground).

Each individual chip 55 is in addition connected to an enabling line 56. The enabling lines 56 are run from an enabling chip 57 to each multi-gate chip 55. The enabling chip 57 selectively enables a particular multi-gate chip 55 to cause that particular chip to scan the series of pads 17 that particular chip services as the chip is instructed to do by the parallel address or read wires.

The enabling chip 57 is itself a multi-gate "and" chip. Four wires g would enable 16 multi-gate chips 55 (FIG. 9 has 14). (Not including a ground.)

In this way any chosen pad 17 on the matrix substrate can be selectively addressed or read.

A 16,000 pad 17 matrix substrate could be addressed or read with two hundred and fifty 64 gate multi-gate chips 55, 4 first level 64 gate enabling chips 57 and 1 super level 4 gate enabling chip (not shown - for enabling the enabling chips.) (14 wires total not including ground or common buss 54.)

Again in order to speed up the testing cycle the central processing circuitry 45 in any of these circuitry embodiments would preferably be programmed with the coordinates of the active pads of matrix substrate 16 for a given circuit board 23 being tested and instructed to examine only those active coordinates for interconnections and opens.

Figures 10A, 10B, 10C:
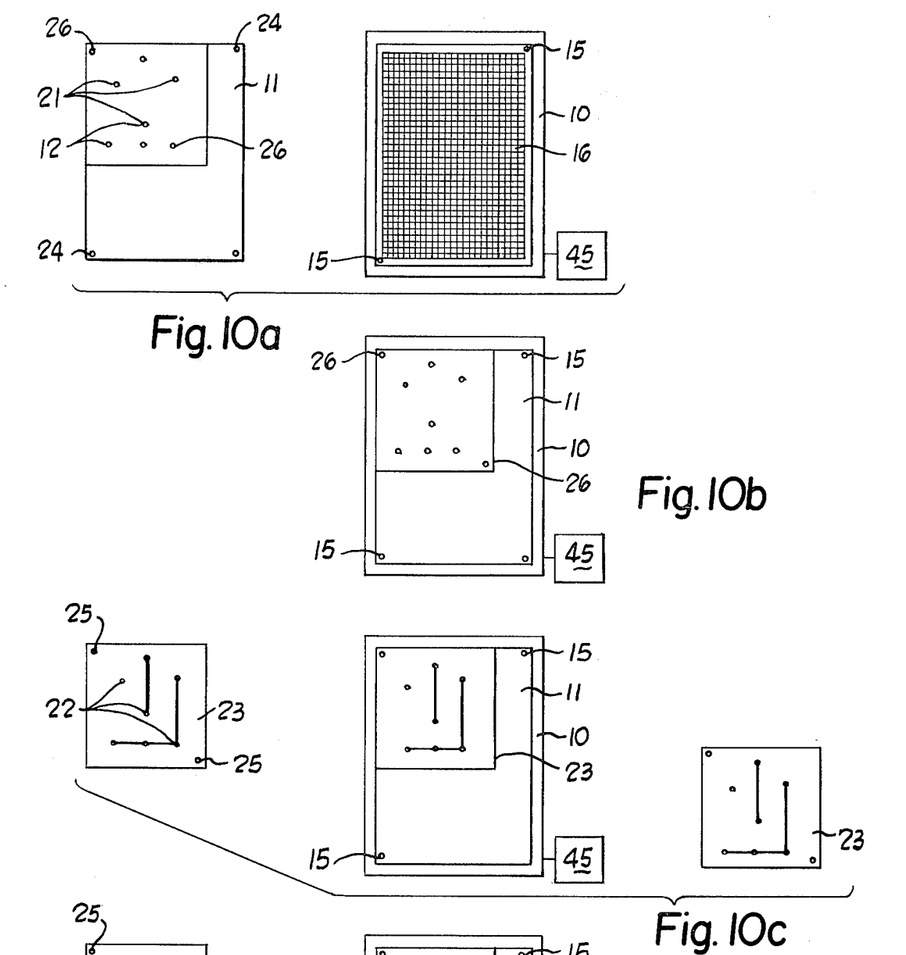
FIG. 10 is a sequence of top-view drawings generally disclosing the method for testing circuit boards of this invention.
Figure 10D:
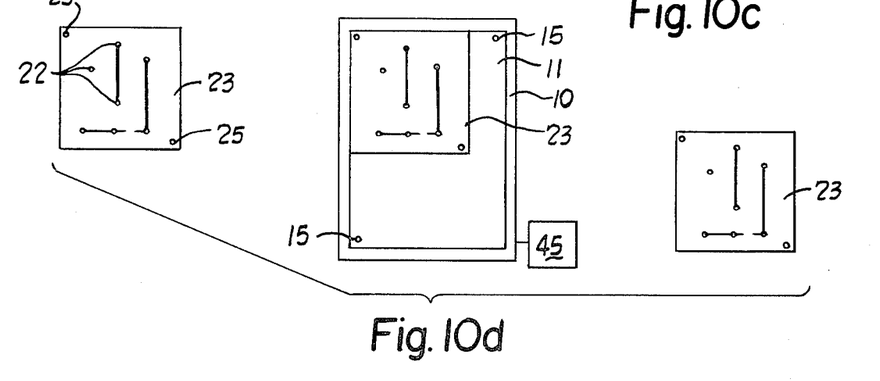

The method of our invention is based upon the matrix testing jig 10 (FIG. 10). The method includes the steps of preparing a pin board 11 step 10a, incorporating the pin board 11 into the matrix testing jig 10 to form the testing apparatus 10b, programming the testing machine 10c and testing circuit boards of unknown quality with the testing apparatus and machine 10d.

The pin board 11 is a plain board, preferably an insulating board. It is sized to be equal to or greater than the pattern of points on the circuit board to be tested.

The pin board 11 is prepared by drilling holes having the pattern of points on the circuit board to be tested in it, inserting double ended electrically conductive pins 12 into these holes, and creating a way of locking the pin board 11 in respect to the matrix substrate 16 and a way of orienting the circuit boards 23 to be tested in respect to the pin board 11.

The holes drilled in the pin board 11 are preferably single sized, the double ended pins 12 preferably having top and bottom portions insuring good contact with the points on the circuit board to be tested and the pads 17 of the matrix substrate 16 respectively, the way of locking the pin board 11 in respect to the matrix substrate 16 preferably locating pins and holes in combination with a tight fit with the frame and vacuum holddown, and the way of orientating the circuit boards to be tested preferably the same way used during the manufacturing process to orient such boards.

After the pin board 11 is prepared, it is incorporated into the matrix testing jig 10 to form the testing apparatus.

The pin board 11 is located in position in respect to the matrix testing jig 10 and locked. The pin board 11 cannot move in respect to the matrix substrate 16. The bottom portion of each pin 12 is in contact with at least one pad 17. The top portion of each pin 12 is avaiable to contact the point on the circuit boards to be tested that top portion is to test. Each pin 12 has a circuit including a pad 17 leading to the testing machine. The means of orienting the circuit boards to be tested is ready to orient such circuit boards. step 10b.

After the pin board 11 is incorporated into the matrix testing jig 10 to form the testing apparatus the testing machine is programmed. Programming is usually done by placing a known good circuit board upon the testing apparatus and instructing the testing machine to program itself with the point to point interconnections present on such good circuit board. step 10c.

The known good circuit board is known to be good because it has been previously examined.

Alternately the testing machine can be separately programmed, or the active pads manually connected to it.

After the testing machine has been programmed the known good circuit board is marked and set aside; in the event that a pin 12 changes position in respect to a pad 17 it may be necessary to recheck the alignment of the testing apparatus and/or reprogram the testing machine.

After the testing machine has been programmed the unknown quality circuit boards are placed upon the testing apparatus in sequence and tested. Step 10d. The testing machine compares the unknown quality circuit board pad 17 interconnections with those of the known good circuit board. If the testing apparatus is connected to a current testing machine with a discrete circuit from every pad 17 to the testing machine all points are examined. If the testing apparatus has the circuitry of this application only the active point to point interconnections are examined. In any event if the readings known good circuit board-unknown quality circuit board are identical that particular unknown quality circuit board is good. If the readings are divergent that particular unknown quality circuit board is bad.

It is possible that sometime during the testing of a sequence of unknown quality circuit boards a number of such boards will be "bad" for similar reasons. This could mean that a pin 12 has changed its point contact in respect to a particular pad. To test this the known good circuit board is again placed upon the testing apparatus and again checked. If the known good circuit board now reads "bad", a pin 12 or series of pins 12 probably did change positions of contact in respect to a pad 17 or a series of pads 17. If so, the testing machine is reprogrammed with the new readings of the known good circuit board. If the known good circuit board reads good, however, the unknown quality circuit boards are probably bad.

Alternately the testing machine can be reprogrammed with the readings of the known good circuit board any time the readings of the unknown quality circuit boards are in doubt.

The apparatus and method of this application are disclosed in relationship to bare and assembled printed circuit boards and as examining the point to point interconnections on such boards with active circuitry. They are, however, capable of testing other structures and with other circuitry. In regards to the structure, for example, an assembled circuit board could be connected to operating voltages and loads with the matrix coded circuitry read 'and' gates (53 of FIG. 8) examining selected points on the active assembled and operating circuit board for voltages, resistance and/or current present at each of these points. The apparatus would troubleshoot a loaded operative board. Please note that the matrix address 'and' gates (52 of FIG. 8) would not be needed for such examination, although leads to properly connect the board to operating voltages and loads would be. Any device having a relatively planar orientation of electrically interconnected points, or able to be converted to such, can be examined by this apparatus and method. In regards to the circuitry, for example, passive circuitry (usually diode biased) similar to that used for key board scanning could be used to determine the shorts and opens present between pads 17; the shorts between pads 17 would be read out as voltages or currents present on various combinations of readout lines for a given line input - the circuit board being tested being the functional equivalent of multiple switch closings between pads 17. The presence or absence of a combination of shorts would be compared with the particular combination of shorts present on the known good board. Any difference equates to a tested board being bad. Due to the possibly random orientation of these shorts and the problem of false positives (a short indicated where there is none), it would be preferable in this passive circuitry example to scan as many axes as possible (x,y,diagonal z and diagonal a) while reading the output of as many of the other axes as possible (respectively) to obtain a multiple plotting of the co-ordinates of the shorted pads (instead of the more normal scan x read y). This is especially important if shorts and opens must be ascertained between pads 17 having a close proximity to each other. Any error induced by the passive circuitry would be accepted as concomitant with the reduced cost of passive circuitry. The scanning of x while reading y,z and a presents a good compromise between accuracy and the complexity of determining the co-ordinates of the shorted pads.

Although this invention has been described in its preferred form with a certain degree of particularity, it is to be understood that numerous changes in the details of construction and mode of operation can be made without departing from the scope of the invention as hereinafter claimed.

What is claimed is:

1. A testing apparatus for use with a testing machine in testing circuit boards having a certain number of contacts laid out in a pattern, the testing apparatus comprising a universal series of electrically conductive pads, said series of pads being on a substrate, said series of pads being laid out in matrix form, the density of said pads being far greater than the density of electrically interconnected contacts, there being spaces between said pads, an interchangeable pin board, means to hold said pin board in respect to said substrate and to orient said pin board in respect to said pads, said pin board having holes, said holes being laid out in the pattern of the certain number of electrically interconnected contacts, double ended electrically conductive pins, said pins being expandable and contractable in a longitudinal direction of said pins, one end of each of said pins capable of bridging said spaces between said pads, said pins being in said holes in said pin board with said one end of each of said pins contacting a pad of said series of pads, means to electrically connect the pads being contacted by said one end of said pins, the active pads, with the testing machine, and means to orient the pattern of the contacts on the circuit board having the certain number of electrically interconnected contacts in respect to the pattern of said pinned holes of said pin board such that each contact on the circuit board is able to be contacted by a pin, respectively, when the circuit board is in testing position.

2. A method for testing circuit boards having a pattern of a certain number of electrically interconnected contacts of a certain density, the method comprising the steps of urging the pattern of electrically interconnected contacts together with a universal series of electrically conductive pads different in density than the electrically interconnected contacts, which pads are electrically connected to a testing machine, and testing the circuit board.

3. A method for testing circuit boards having a pattern of a number of electrically interconnected contacts of a certain density, the method comprising the steps of preparing a pin board having a series of holes replicating the pattern of the number of electrically interconnected contacts, inserting double ended electrically conductive pins in the series of holes in the pin board, positioning the pinned pin board over a universal series of pads that are electrically connected with a testing machine, the pads being different in density than the electrically interconnected contacts, with each pin contacting a pad, positioning the pattern of electrically interconnected contacts in contact with the pins and testing the circuit board.

4. A method for testing circuit boards or other electrical devices having a pattern of a number of electrically interconnected contacts of a certain density, the method comprising the steps of preparing a non-electrically conductive pin board having a series of uniform sized holes replicating the pattern of the number of electrically interconnected contacts, inserting double ended longitudinally expandable and contractable electrically conductive pins having one blunt end into the series of uniform sized holes in the pin board, positioning the pinned pin board over a series of universal space separated electrically conductive pads that are electrically connected with a testing machine, the blunt end of the pins being capable of bridging the spaces separating the pads, the pads being different in density than the electrically interconnected contacts, with the blunt end of each pin contacting a pad of the series of pads, positioning the pattern of electrically interconnected contacts in contact with the pins and testing the circuit board.

5. A testing apparatus for use with a testing machine in testing electrical equipment having a plurality of electrically interconnected contacts, the testing apparatus comprising a universal series of electrically conductive pads, the density of said pads being different than the density of the electrically interconnected contacts, said pads being narrowly spaced, means to support said pads, means to orient the certain number of electrically interconnected contacts being tested with respect to said pads and means to electrically connect said contacts to said pads.

6. The testing apparatus of claim 5 characterized in that the electrical connection to the testing machine is by means of digitally addressed gates.

7. In a testing apparatus for use in testing electrical equipment having a plurality of electrically interconnected contacts, the testing apparatus having a series of mechanically supported electrically conductive pads for connection to a testing machine and means to orient the plurality of electrically interconnected contacts with respect to such pads, the improvement comprising the series of mechanically supported electrically conductive pads being universal for use in testing differing electrical equipment, the density of the electrically conductive pads being different than the density of the electrically interconnected contacts, and means to urge the pads together with the contacts of the electrical equipment.

8. In a testing apparatus for use in testing electrical equipment having a plurality of electrically interconnected contacts having a contact size and laid out in a pattern, such testing apparatus including a series of spaced electrically conductive pads for electrical connection to a testing machine, the improvement comprising the electrically conductive pads being universal and different in density than the electrically interconnected contacts, the spaces between the electrically conductive pads being smaller than the general contact size of the electrically interconnected contacts and means to move one of the electrically conductive pads or the electrically interconnected contacts into contacts with the other of the electrically conductive pads or the electrically interconnected contacts, the size of the spaces compensating for the difference in density between the electrically conductive pads and the electrically interconnected contacts.

9. In a testing apparatus for use in testing electrical equipment having a plurality of electrically interconnected contacts laid out in a pattern, such testing apparatus having a series of mechanically supported electrically conductive pads for electrical interconnection to a testing machine, an intermediate member located in respect to such series of conductive pads, electrically conductive pins carried by the intermediate member, the pins laid out in the pattern of plurality of electrically interconnected contacts, the pins electrically bridging the distance between the plurality of electrically interconnected contacts and the series of electrically conductive pads, the improvement comprising the electrically conductive pads for electrical connection to the testing machine being universal and different in density than the electrically connected contacts for use selectively with differing intermediate boards.

10. In a testing apparatus for use in testing electrical equipment having a plurality of electrically interconnected contacts laid out in a pattern, such testing apparatus having a series of spaced mechanically supported electrically conductive pads for electrical connection to a testing machine, an intermediate member located in respect to such series of electrically conductive pads, and electrically conductive pins carried by the intermediate member, the pins laid out in the pattern of plurality of electrically interconnected contacts, each of the pins having an end for contact with the electrically conductive pads, such end of the pin having contact width, the pins electrically bridging the distance between the plurality of electrically interconnected contacts and the series of electrically conductive pads, the improvement comprising the electrically conductive pads for electrical connection to the testing machine being universal for use selectively with differing intermediate boards and the contact width of the ends of the pins being generally greater than the spaces between the electrically conductive pads whereby the ends of the pins are capable of electrically bridging the spaces between the pads.

11. In a testing apparatus for use in testing electrical equipment having a plurality of electrically interconnected contacts laid out in a pattern, such testing apparatus having a series of mechanically supported electrically conductive pads for electrical interconnection to a testing machine, adjacent pads being effectively spaced by a distance, an intermediate member located in respect to such series of conductive pads, electrically conductive pins carried by the intermediate member, the pins laid out in the pattern of the plurality of electrically interconnected contacts to be tested, the pins electrically bridging the distance between the plurality of electrically interconnected contacts and the series of electrically conductive pads, each of the pins having an end for contact with the electrically conductive pads, such end having a contact width, the improvement comprising the series of mechanically supported electrically conductive pads being universal for use selectively with differing intermediate members, the density of electrically conductive pads for electrical connection to the testing machine being different than the density of electrically connected contacts and the contact width of the of the pins being generally greater than the distance between adjacent electrically conductive pads, whereby the ends of the pins are capable of bridging the spaces between the pads and thus do not have to be in alignment with the electrically conductive pads in order for there to be guaranteed electrical connections between the certain number of electrically interconnected contacts and the testing machine.

12. In a testing apparatus for use in testing electrical equipment having a plurality of electrically interconnected contacts laid out in a pattern, such testing apparatus having a series of mechanically supported electrically conductive pads for electrical connection to a testing machine, adjacent pads being effectively spaced by a distance, an intermediate member located in respect to such series of electrically conductive pads, the intermediate member having holes laid out in the pattern of the plurality of electrically interconnected contacts to be tested, and electrically conductive pins in the holes in the intermediate member, the pins electrically bridging the distance between the plurality of electrically interconnected contacts and the series of electrically conductive pads, each of the pins having an end for contact with the electrically conductive pads, such end having a contact width, the pins extending substantially perpendicularly to both the electrically interconnected contacts and the electrically conductive pads, the improvement comprising the electrically conductive pads being universal for use selectively with differing intermediate members, the density of electrically conductive pads being different than the density of electrically interconnected contacts, the electrically conductive pads being laid out substantially in a systematic pattern, and the contact width of the end of each of the electrically conductive pins being generally greater than the distance between adjacent electrically conductive pads, the relationship between the contact width of the ends of the electrically conductive pins and the distance between the adjacent electrically conductive pads allowing the pins to bridge over such spaces if appropriate and thus allowing for use of universal electrically conductive pads with guaranteed electrical connection to the testing apparatus and without substantial regard for the difference between the number or the pattern of electrically interconnected contacts and the electrically conductive pads.

13. A method for testing circuit boards having a pattern of a plurality of electrically interconnected contacts, the method comprising the steps of urging the pattern of electrically interconnected contacts together with a universal series of electrically conductive pads different in density than the electrically interconnected contacts, which pads are electrically connected to a testing machine, the spaces between such pads being smaller than the electrically interconnected contacts such that the contacts may bridge over such spaces, and testing the circuit board.

14. The testing apparatus of claim 1 wherein the circuit boards have orientation holes utilized during the manufacturing process of such boards and characterized in that said means to orient the pattern of contacts on the circuit board in respect to said pattern of said pinned holes of the pin board utilizes the orientation holes of the circuit boards.

15. The testing apparatus of claim 7 characterized by the addition of means to electrically scan substantially only the pads in contact with the contacts of the electrical equipment.

16. The testing apparatus of claim 7 characterized by the addition of a series of multi-stage chips, said multi-stage chips connecting the electrically conductive pads to the testing machine.

17. The testing apparatus of claim 7 wherein the electrical equipment having a plurality of contacts has orientation holes used during the manufacturing process of such equipment and characterized in that the means to orient the plurality of contacts with respect to the pads utilizes the manufacturing orientation holes.

18. The testing apparatus of claim 9 characterized by the addition of means to electrically scan substantially only the electrically conductive pads in contact with the electrically conductive pins, the active pads.

19. The testing apparatus of claim 9 wherein the electrical equipment having contacts laid out in a pattern has orientation holes used in the manufacturing process of such equipment and characterized in that these orientation holes are utilized to align the electrically conductive contacts with the electrically conductive pins.

20. The testing apparatus of claim 11 wherein the electrical equipment having contacts laid out in a pattern has orientation holes used in the manufacturing process of such equipment and characterized in that these orientation holes are utilized to align the electrically conductive contacts with the electrically conductive pins.

21. The testing apparatus of claim 11 characterized by the addition of means to electrically scan substantially only the electrically conductive pads in contact with the electrically conductive pins, the active pads.

* * * * *